(12) United States Patent (10) Patent No.: US 12,310,265 B2
Li et al. (45) Date of Patent: May 20, 2025

(54) DOME-SHAPED PHASE CHANGE MEMORY MUSHROOM CELL

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Louis Zuoguang Liu, Schenectady, NY (US); Arthur Roy Gasasira, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 460 days.

(21) Appl. No.: 17/807,915

(22) Filed: Jun. 21, 2022

(65) Prior Publication Data

US 2023/0413694 A1 Dec. 21, 2023

(51) Int. Cl.
*H10N 70/00* (2023.01)
*H10N 70/20* (2023.01)

(52) U.S. Cl.
CPC ......... *H10N 70/826* (2023.02); *H10N 70/011* (2023.02); *H10N 70/231* (2023.02); *H10N 70/8413* (2023.02); *H10N 70/8616* (2023.02)

(58) Field of Classification Search
CPC .. H10N 70/826; H10N 70/011; H10N 70/231; H10N 70/8413; H10N 70/8616; H10N 70/061; H10N 70/8828
See application file for complete search history.

(56) References Cited

U.S. PATENT DOCUMENTS

| | | | |
|---|---|---|---|
| 8,143,612 B2 | 3/2012 | Lung |
| 9,082,969 B2 | 7/2015 | Cha |
| 11,145,814 B2 | 10/2021 | Gong |
| 11,239,418 B2 | 2/2022 | Cheng |
| 2008/0303015 A1 | 12/2008 | Happ |
| 2009/0101883 A1 | 4/2009 | Lai |
| 2010/0032290 A1 | 2/2010 | Kikuchi |
| 2010/0173479 A1 | 7/2010 | Joo |
| 2019/0345607 A1 | 11/2019 | Carta |

(Continued)

FOREIGN PATENT DOCUMENTS

| | | |
|---|---|---|
| CN | 101777389 B | 2/2013 |
| CN | 204118135 U | 1/2015 |
| CN | 109119534 B | 5/2019 |

OTHER PUBLICATIONS

International Search Report and Written Opinion for Application PCT/IB2023/056021, Sep. 21, 2023, 16 pages.

*Primary Examiner* — Karen Kusumakar
(74) *Attorney, Agent, or Firm* — Jared C. Chaney

(57) ABSTRACT

A mushroom memory cell may be formed by depositing a second dielectric layer on top of a first dielectric layer and a heater, depositing a hard mask on top of the second dielectric layer, performing a directional reactive-ion etching to remove an exposed portion of the second dielectric layer, performing a lateral etching to remove a portion of the second dielectric layer under the hard mask, performing directional deposition of a phase change material (PCM) over the heater, depositing a covering dielectric over the PCM, performing a second directional etching to expose a top surface of the PCM, and depositing a top electrode on the surface of the PCM.

14 Claims, 16 Drawing Sheets

(56) References Cited

U.S. PATENT DOCUMENTS

| | | | | |
|---|---|---|---|---|
| 2020/0013951 A1* | 1/2020 | Wu | ........................ | H10B 63/80 |
| 2020/0411755 A1* | 12/2020 | Lin | .................... | H10N 70/8413 |
| 2021/0050518 A1* | 2/2021 | Gong | ................... | H10N 70/063 |
| 2021/0066590 A1* | 3/2021 | Lin | ....................... | H10N 70/063 |
| 2021/0135104 A1* | 5/2021 | Ok | ..................... | H10N 70/8265 |

* cited by examiner

DOME-SHAPED PHASE CHANGE MEMORY MUSHROOM CELL

BACKGROUND

Aspects of the present disclosure relate to the creation and configuration of Dome-shaped phase change memory mushroom cells.

In general, NVRAM (non-volatile random-access memory) is a type of digital memory that holds data even without power to the memory chips. NVRAM is a kind of non-volatile memory (NVM), which includes storage-class memory based on NAND flash.

In some instance, NVRAM may be used to hold information about the state of a computer for faster boot times. Thus, startup information for the components and devices in the computer may be stored from one use to the next while the system power is turned off. Standard computer memory uses dynamic random access memory (DRAM) which requires constant power to retain data.

BRIEF SUMMARY

The present disclosure provides a method, a memory cell device, and method of using a memory cell device for the creation and configuration of dome-shaped phase change memory mushroom cells. In some embodiments, the method includes depositing a second dielectric layer on top of a first dielectric layer and a heater, depositing a hard mask on top of the second dielectric layer, performing a directional reactive-ion etching to remove an exposed portion of the second dielectric layer, performing a lateral etching to remove a portion of the second dielectric layer under the hard mask, performing directional deposition of a phase change material (PCM) over the heater, depositing a covering dielectric over the PCM, performing a second directional etching to expose a top surface of the PCM, and depositing a top electrode on the surface of the PCM.

In some embodiments of the present disclosure, a memory mushroom cell may include a phase change material (PCM) over a heater, and a dielectric surrounding the PCM.

Some embodiments of the present disclosure, the method may include applying an electrical current to a bottom electrode of a memory cell, increasing a temperature, based on the applied electrical current, of a heater electrically connected to the bottom electrode, forming an amorphous dome in a shaped phase change material (PCM) thermally and electrically connected to the heater based on the increasing temperature of the heater, and recording a resistance from the bottom electrode to a top electrode, where the top electrode is electrically connected to the PCM.

DETAILED DESCRIPTION

Aspects of the present disclosure relate to creation and configuration of Dome-shaped phase change memory mushroom cells. While the present disclosure is not necessarily limited to such applications, various aspects of the disclosure may be appreciated through a discussion of various examples using this context.

Phase change memory cells are an emerging non-volatile (NV) random-access (RAM) which offers some advantage over existing non-volatile memories (NVMs). It has potentials for both classic memory applications and neuromorphic computing.

In some embodiments, a mushroom cell with dome-shape crystalline phase change material cell is proposed. In some embodiments, the proposed mushroom cell has a dome-shaped or trapezoid shaped crystalline phase change material cell, which has filled dielectric material (or dielectric material with airgaps embedded) on the PCM material sidewalls; and a reduced contact area of between the top metal electrode and phase change material to reduce the thermal dissipation through PCM and top electrode, and thus improve the thermal insulation for reduced SE/RESET current.

Figure 1A:
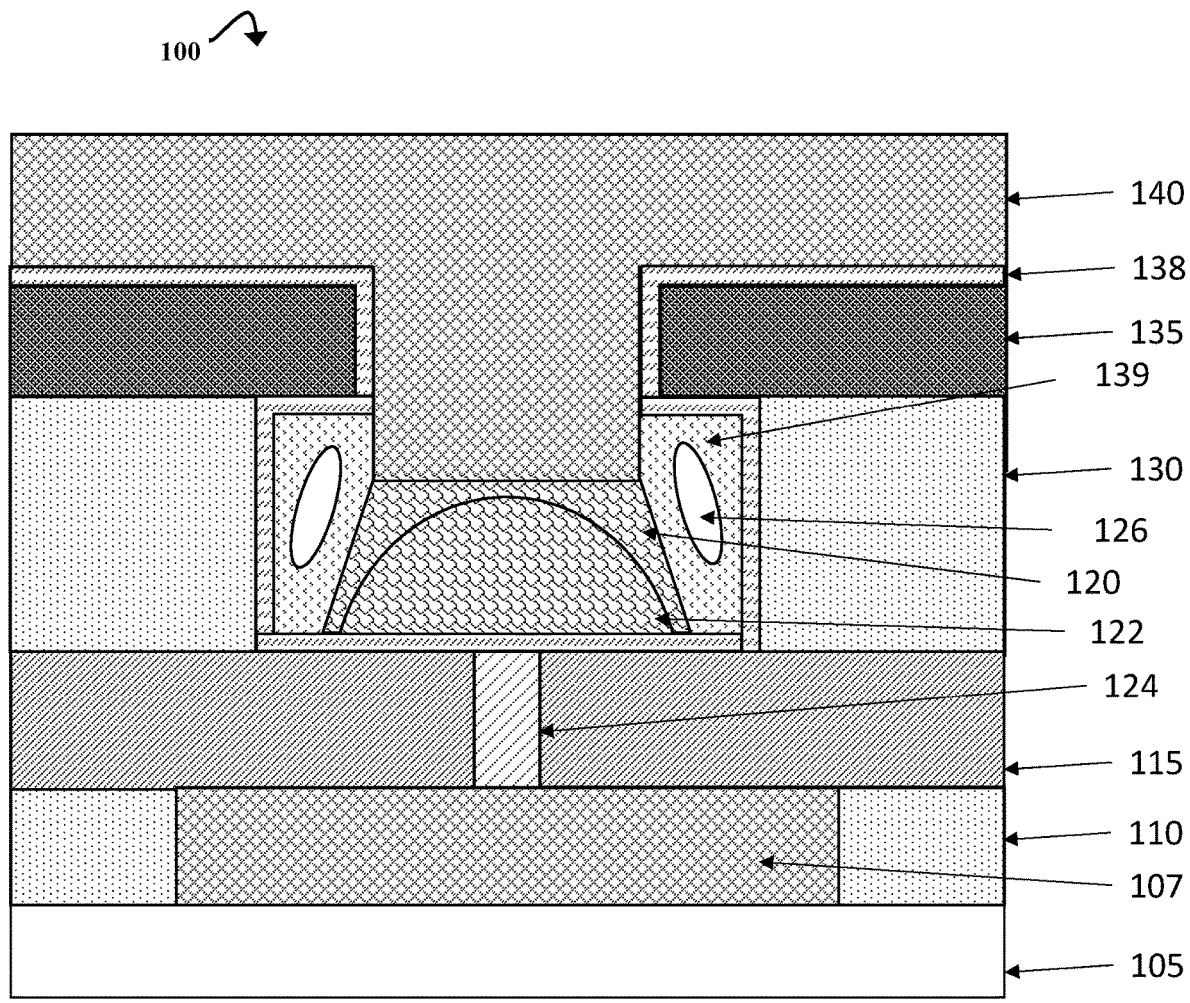
FIG. 1A depicts a cross-section of an example dome-shaped phase change memory mushroom cell after fabrication, according to various embodiments of the present invention.

FIG. 1A depicts a cross-section of an example dome-shaped phase change memory mushroom cell 100 (herein, cell 100) after fabrication. In some embodiments, cell 100 may include a substrate 105, a bottom electrode 107 surrounded by an interlayer dielectric (dielectric material) 110, a dielectric 115, a phase change material (PCM) 120 including amorphous dome 122, heater 124, an interlayer dielectric (second dielectric layer) 130 surrounding PCM 120, and a top electrode 140. In some embodiments, a conformal resistive liner 138 may be deposited, in other embodiments a conformal resistive liner may not be used. In some embodiments, a hard mask 135 may be included. In some embodiments, PCM 120 may be dome shaped or trapezoid shaped with a filled dielectric material 139 on the PCM material side walls. Included embodiments may include airgaps 126 as described herein. Some embodiments may not have airgaps. Substrate 105 may be composed of any semiconductor substrate material. For example, substrate 105 can be composed of a silicon substrate, a group IV semiconductor material, a group III-V semiconductor material, a group II-VI semiconductor material, a silicon on insulator (SOI), or other known semiconductor material used in semiconductor chips. In some embodiments, substrate 105 is a silicon-on-insulator substrate. In various embodiments, substrate 105 is a wafer or a portion of a wafer. In various embodiments, substrate 105 includes one or more semiconductor devices. For example, substrate 105 may include transistors, isolation structures, contacts, or any other semiconductor device elements formed in a semiconductor wafer or semiconductor substrate. In some embodiments, substrate 105 may be a prebuilt substrate with devices (e.g., transistors). For example, transistors may be used a selector for a memory cell 100. Thus, the transistor may be turned on passing current through bottom electrode 107 to heater 124.

The proposed cell 100 has a reduced contact area between the top metal electrode 140 and phase change material (PCM 120) to reduce the thermal dissipation through PCM 120 and top electrode 140 resulting in improved thermal insulation for reduced SET/RESET current. The proposed cell 100 also has dome-shaped or trapezoid shaped phase change material cell, which has filled dielectric material (or dielectric material with airgaps embedded) on the PCM material sidewalls, which can help reduce the thermal dissipation into surrounding material and thus help reduce SET/RESET current.

FIG. 1B-1K depicts the example dome-shaped phase change memory mushroom cell 100 during various stages of fabrication.

Figure 1B:
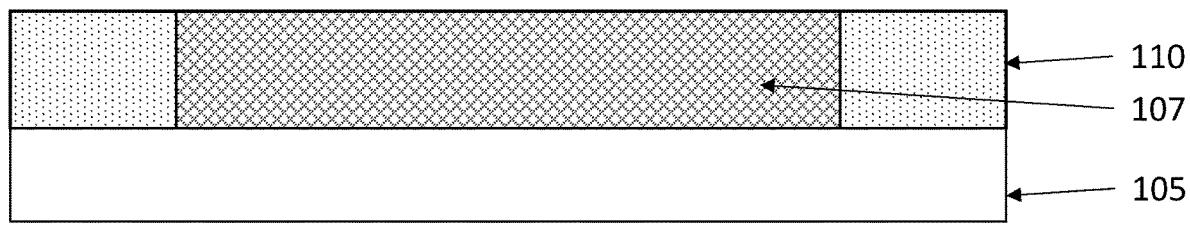
FIG. 1B-1K depicts the example dome-shaped phase change memory mushroom cell during various stages of fabrication, according to various embodiments of the present invention.

In FIG. 1B, bottom electrode 107 is formed on substrate 105 and surrounded by a dielectric 110 material (e.g., silicon oxide). Dielectric 110 resides on substrate 105. Dielectric 110 can be a layer of a dielectric material, deposited with known deposition processes. For example, dielectric layer 110 can be composed of one or more dielectric materials, including but not limited to silicon dioxide (SiO2), silicon nitride (SiN), silicon carbide (SiC), silicon oxynitride (SiON), carbon-doped silicon oxide (SiOC), carbon doped silicon oxide (SiO:C), fluorine-doped silicon oxide (SiO:F), silicon-carbon-nitride (SiCN), boron nitride (BN), silicon boron nitride (SiBN), silicoboron carbonitride (SiBCN), silicon oxycarbonitride (SiOCN), silicon oxide (SiO), boron carbon nitride (BCN), hydrogen silsesquioxane polymer (HSQ), methyl silsesquioxane polymer (MSQ), methyl doped silica (SiO:(CH3)), organosilicate glass (SiCOH), porous SiCOH, or any another suitable dielectric material used in semiconductor device formation. Bottom electrode 107 may be formed of any conductive material used in semiconductor chip electrodes. The bottom electrode 107 can be formed, for example, by a conventional complementary metal-oxide-semiconductor (CMOS) back-end-of-line (BEOL) damascene process (e.g., tungsten, cobalt, or copper surrounded by low-k dielectric). Bottom electrode 107 may be composed of but is not limited to, copper (Cu), titanium nitride (TiN), tungsten (W), tungsten nitride (WN), tungsten carbide (WC), silver (Ag), gold (Au), aluminum (Al) or multilayered stacks thereof. In various embodiments, bottom electrode 107 is a bit line. For example, bottom electrode 107 may be a bit line in a crossbar array of PCM devices that extends into and out of the drawing page.

Figure 1C:
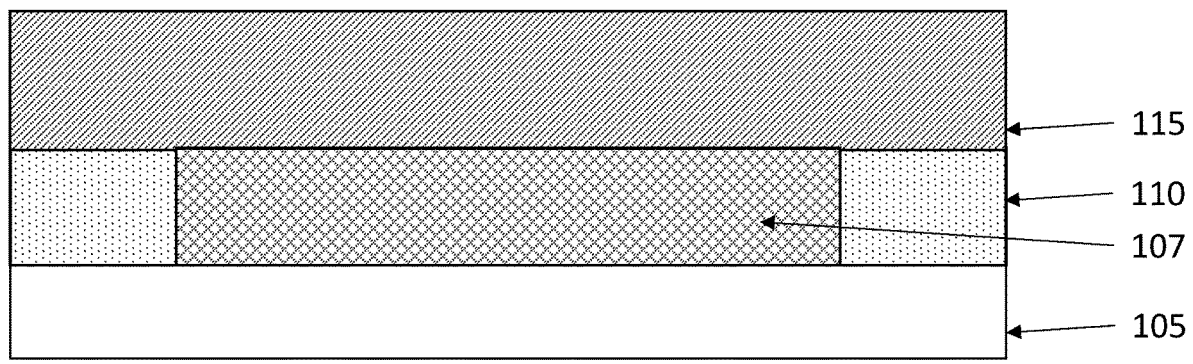

In FIG. 1C, the dielectric 115 (e.g., silicon nitride (SiN) is deposited.

Figure 1D:
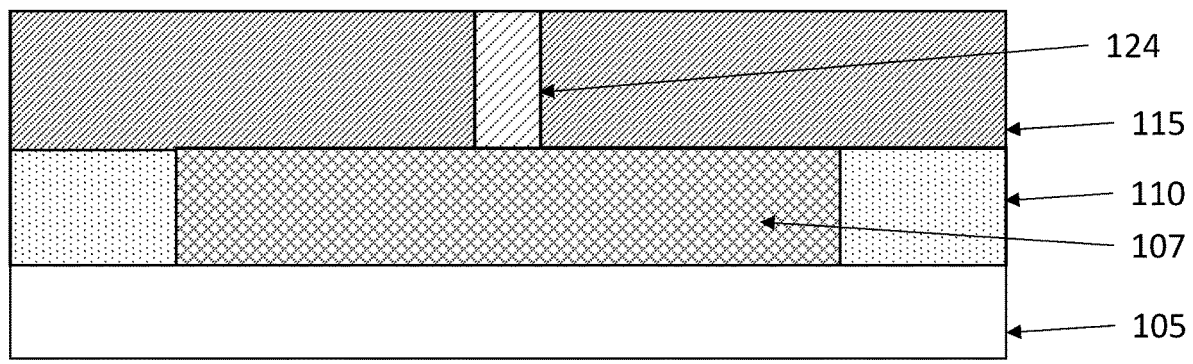

In FIG. 1D, lithography techniques are used to pattern contact holes or vias in the dielectric 115, and then metal (e.g., titanium nitride or tungsten) is patterned in the hole to form heater 124. For example, the metal may be deposited with atomic layer deposition in a multi later process with multiple metals. Using a known deposition process such as chemical vapor deposition (CVD), physical vapor deposition (PVD), atomic layer deposition (ALD), metal-organic chemical vapor deposition (MOCVOD), plasma-enhanced chemical vapor deposition (PECVD), or the like, a conducting material is deposited in the via to form heater 124. The conducting material for heater 124 can a material such as but not limited to titanium nitride (TiN), tungsten (W), tantalum nitride (TaN), TiAl, or other similar resistive metal material which can provide joule heating to the PCM 120 in the completed PCM device. In one or more embodiments, the heater 124 can include multiple different electrically conductive materials that can be arranged in multiple layers of materials (e.g., TaN/TiN/TaN). After filling the via with the conducting material, a chemical mechanical polishing (CMP) removes excess material for heater 124 from the top surface of dielectric 115 material. The heater 124 can have a relatively small sectional area, which focuses electrical current that is run through the PCM 120. This allows heater element to generate heat through resistive heating during a pulse of electricity, which can be used to selectively change the temperature of the PCM 120, for example, above the crystallization temperature and the melting temperature of phase-change material.

Figure 1E:
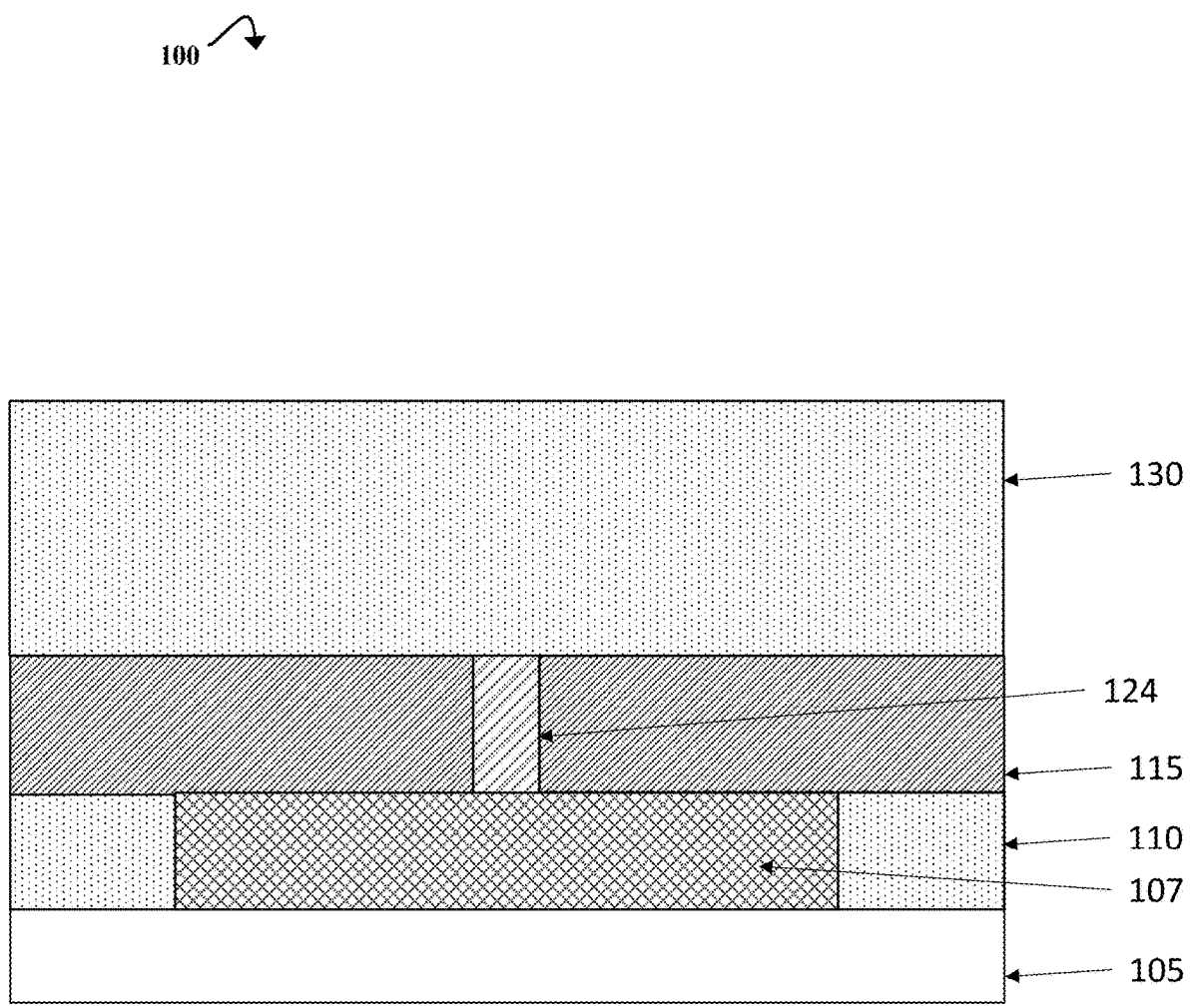

In FIG. 1E, second dielectric layer 130 is deposited.

Figure 1F:
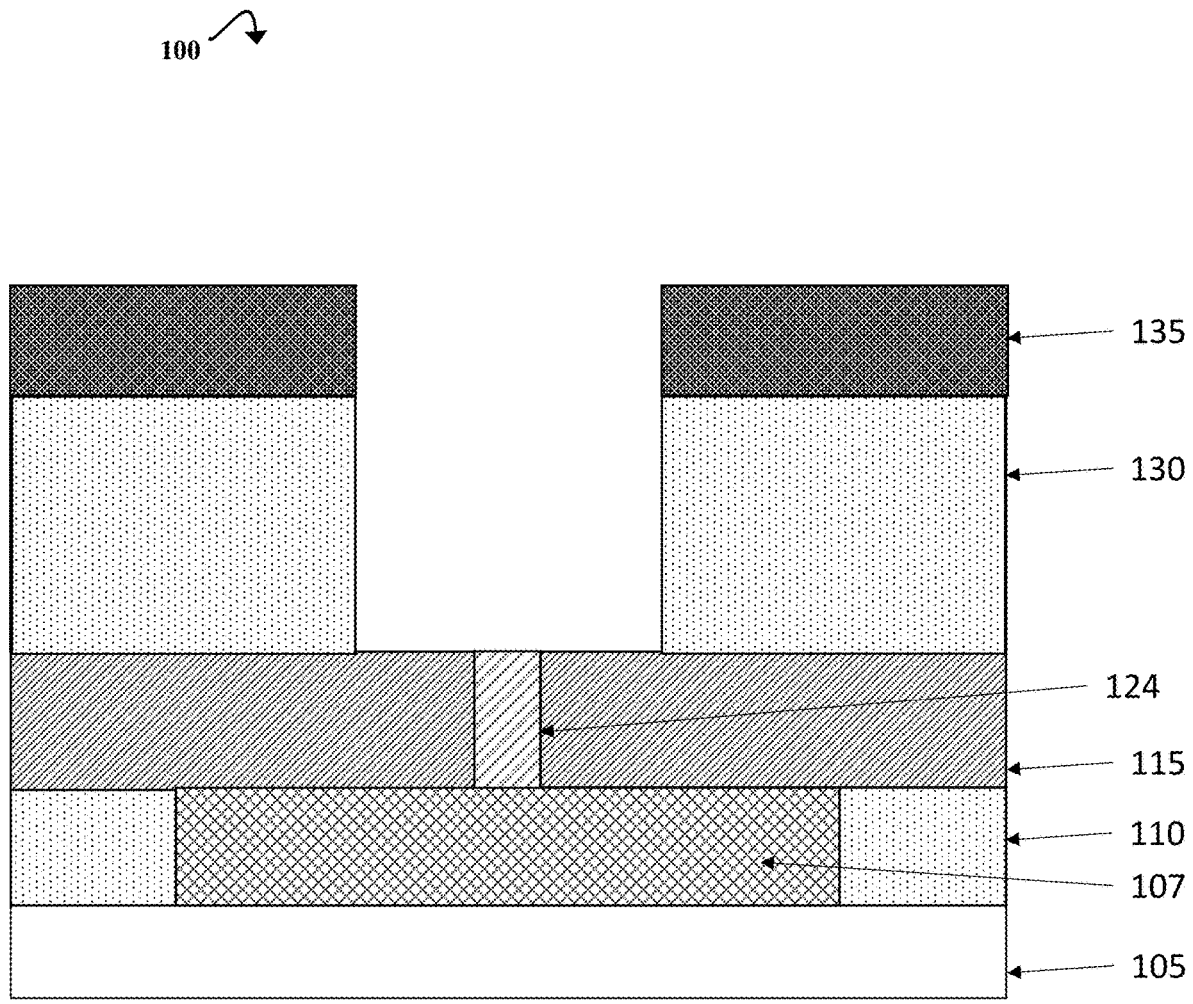

In FIG. 1F, lithography is used to deposit a hard mask 135 and a directional reactive-ion etching is used to remove the exposed portion of second dielectric layer 130. For example, heater 124 is exposed by the etching.

Figure 1G:
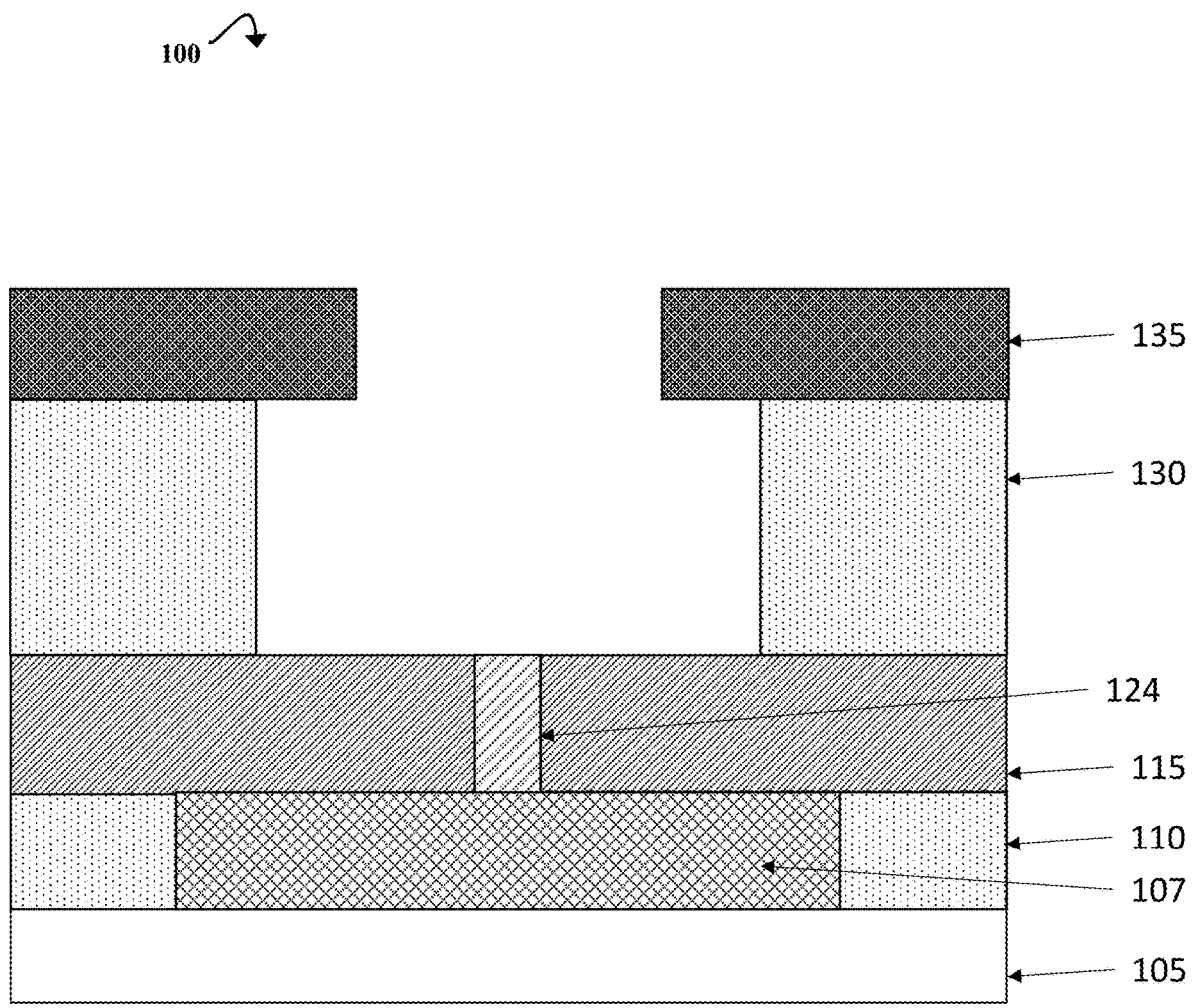

In FIG. 1G, a lateral etching is performed to remove some of the second dielectric layer 130 under hard mask 135. In some embodiments, in-situ argon (Ar) plasma cleaning may be used to remove residual dielectric. In some embodiments, the lateral etching may be an isotropic etch (either wet or dry etching). In some instances, the etching edges may be curved (not depicted). For example, 90 degree corners are depicted in FIG. 1G for ease of understanding, but actual edges may be rounded or concave.

Figure 1H:
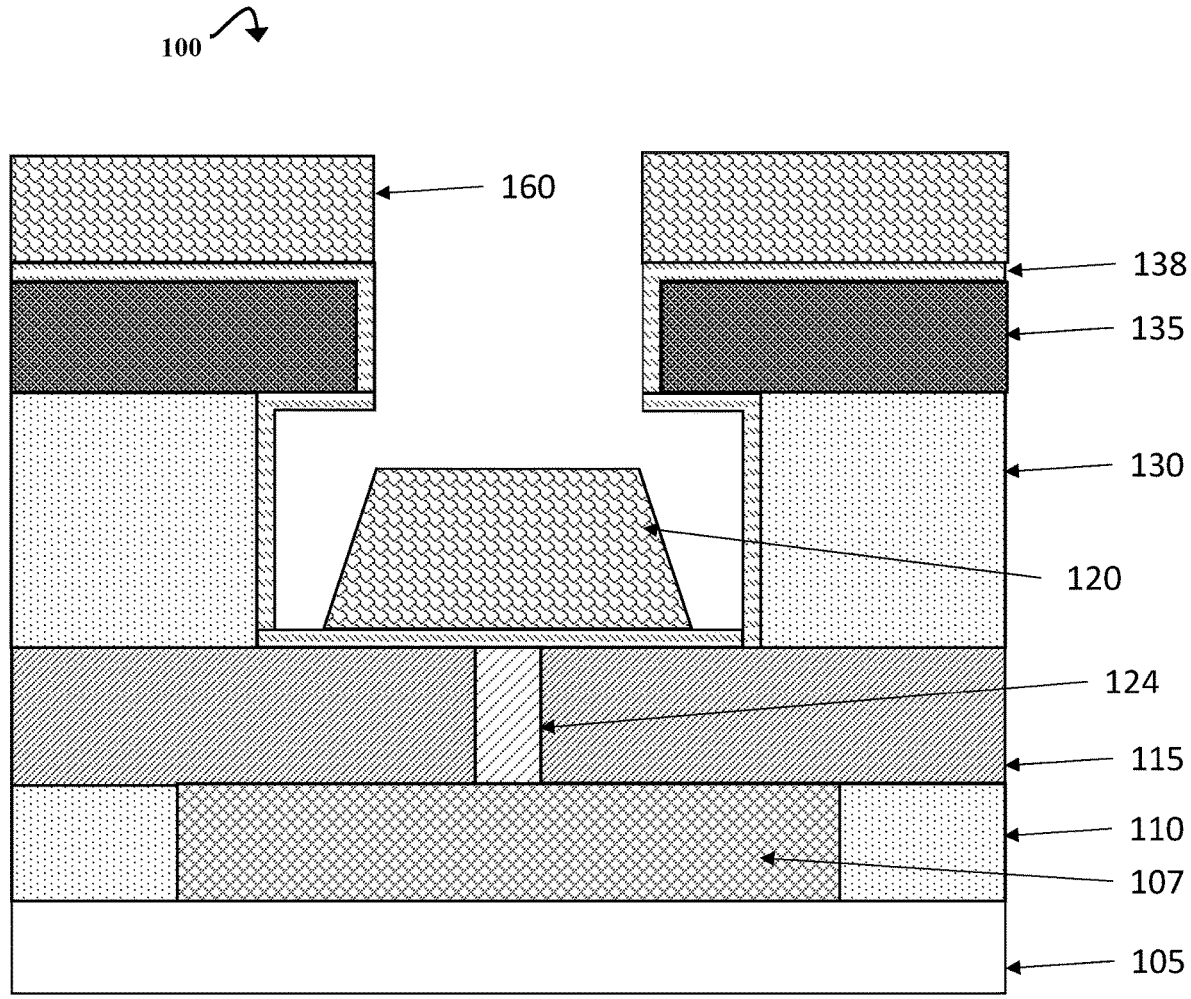

In FIG. 1H, conformal resistive liner 138 (e.g., tantalum nitride (TaN)) may be deposited. For example, TaN may be deposited by an atomic layer deposition (ALD) process to uniformly cover the surface (even the non-line of sight areas). Conformal resistive liner 138 can also be composed of other conductive materials such as, for example, aluminum nitride (AlN), boron nitride (BN), aluminum oxide (AlO), TaN, W, tungsten nitride (WN), cobalt tungsten (CoW), nickel tungsten (NiW), yttrium oxide (YO), or alloys of these materials. The electrical resistance of resistive liner 138 is substantially greater than the resistance of PCM 120 in low resistance state or crystalline phase (e.g., ten to thirty or more times higher) and substantially lower than the resistance of PCM 120 in high resistance state (e.g., five to twenty or more times lower). Resistive liner 138 can be deposited 1 nanometer to ten nanometers thick in order to improve electrical function, such as mitigating resistance drift in the completed device. As known to one skilled in the art, the amorphous state of PCM 120 can exhibit a resistance drift over time and when resistive liner 138 is not present, the read current passes through the amorphous PCM 120 which may have a changing electrical resistance that adversely affects PCM device performance. In some embodiments, a directional deposition of a PCM is performed to deposit PCM 120 and extra PCM area 160. For example, directional deposition may only deposit the PCM at the center resulting in PCM 120. Some examples of directional deposition include physical vapor deposition (PVD) or sputtering with bias on the substrate. In some embodiments, the structure formed may be curved (not depicted in FIG. 1H) or trapezoidal (depicted). Phase-change material PCM 120 may be composed of germanium-antimony-tellurium (GeSbTe also known as GST) or a germanium-tellurium compound material (GeTe). Alternatively, other suitable materials for phase-change material 120 can include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys combinations thereof, or another other phase-change material suitable for use in a PCM device. Phase-change material 120 may be undoped or doped (e.g., doped with one or more of O, N, Si, or Ti).

Figure 1I:
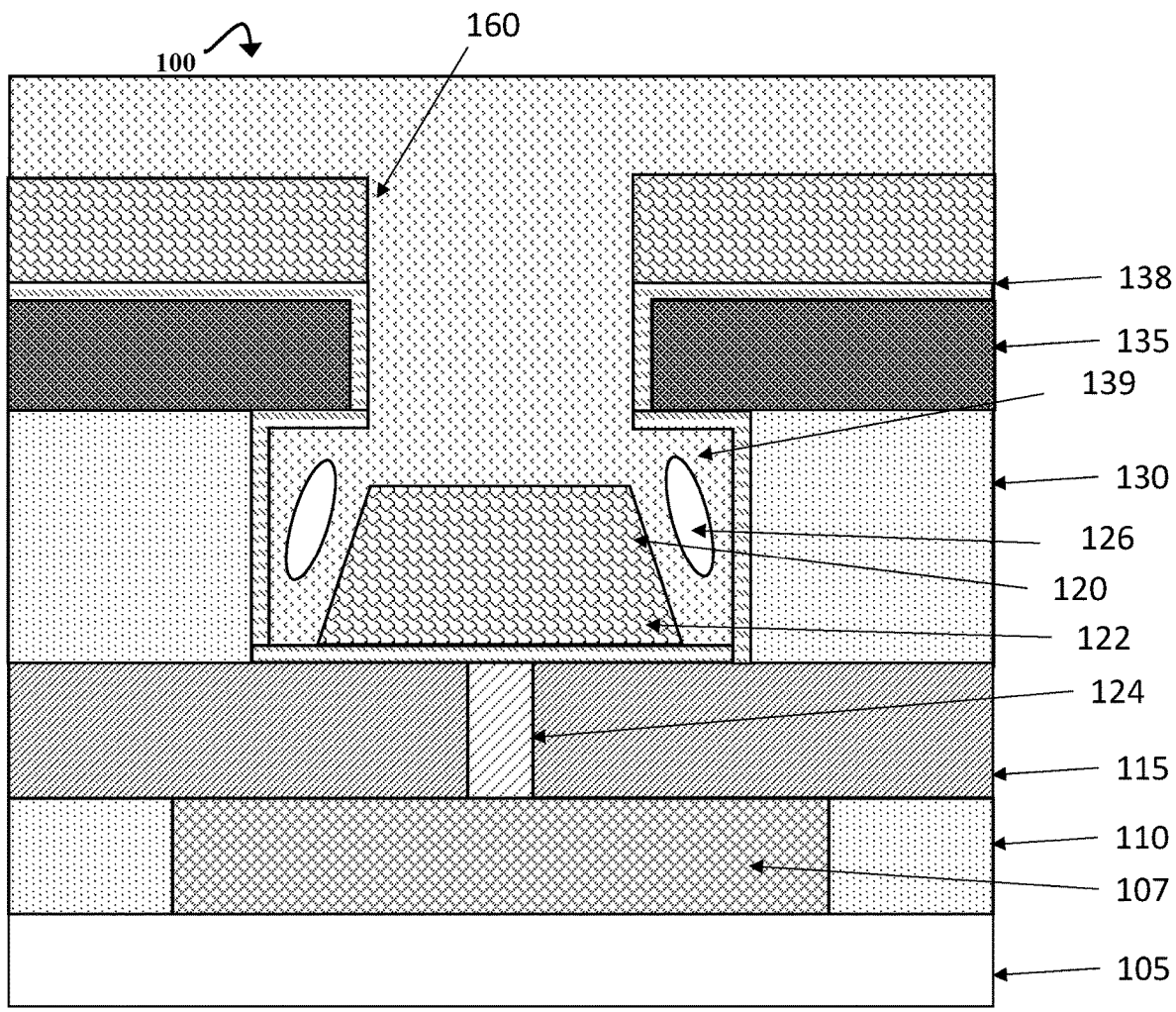

In FIG. 1I, a nonconformal dielectric deposition may be used to deposit a dielectric material 139 with low thermal conductivity (e.g., SiON). In some embodiments, airgap 126 may be formed due to the overhang and/or the non-conformal deposition. For example, the shadow created by hard mask 135 may not allow direct line deposition thus not allowing deposition at the same rate in the regions of airgap 126. In some instances, the shape of airgap 126 may take forms others than those depicted. In some embodiments, the airgaps may help reduce the thermal loss.

Figure 1J:
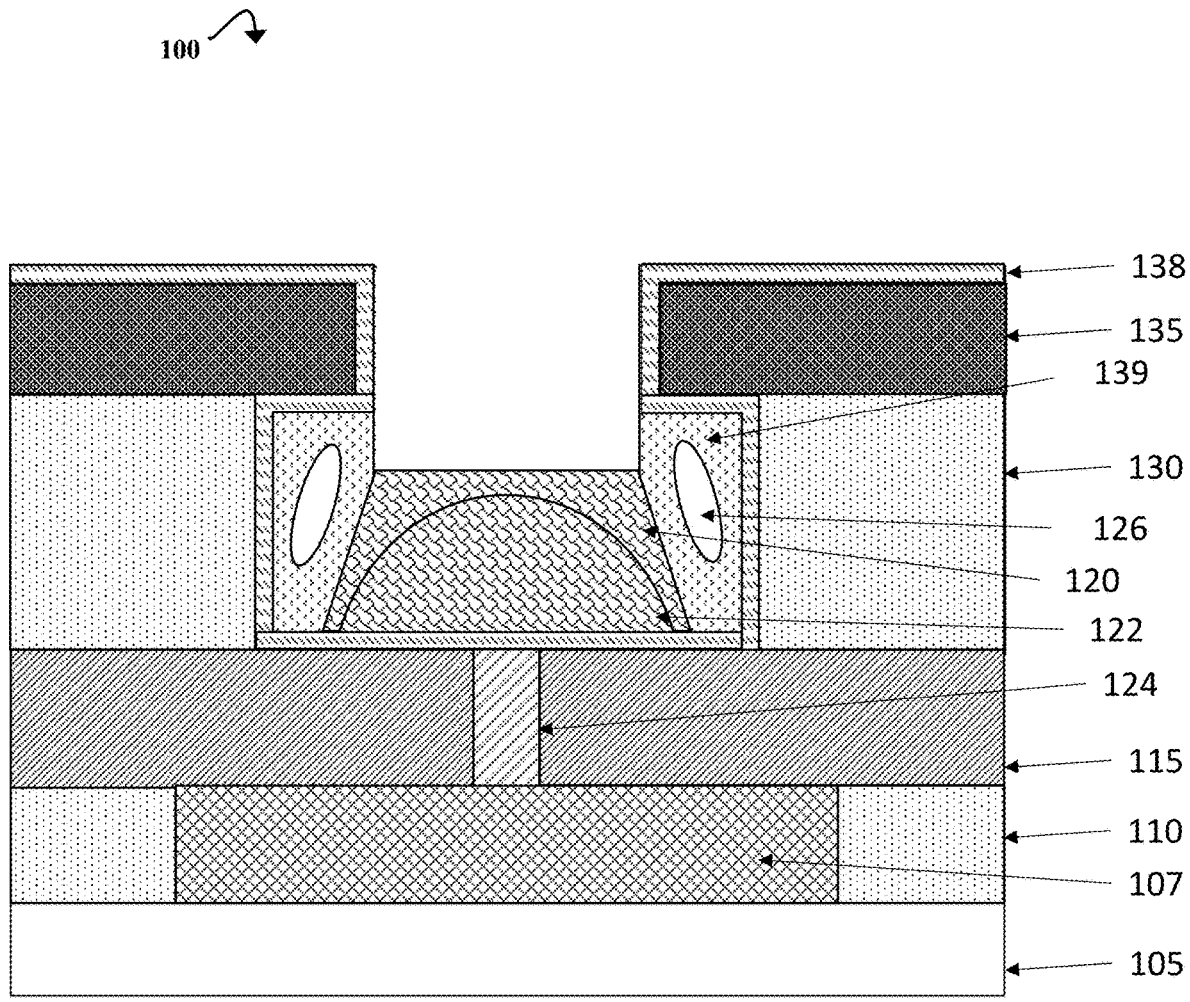

In FIG. 1J, a CMP may be used to planarize the surface removing extra PCM area 160 stopping on the hard mask 135 (not depicted) or the conformal resistive liner 138 (depicted), as the top surface of the TaN nitride under extra PCM area 160 does not affect the end product. In some instances, a second directional etching (e.g., directional ion etching) may be used to expose the top surface of PCM 120. It may be envisioned, at this point in the processing, that a via is created down to PCM 120 from the top of cell 100.

Figure 1K:
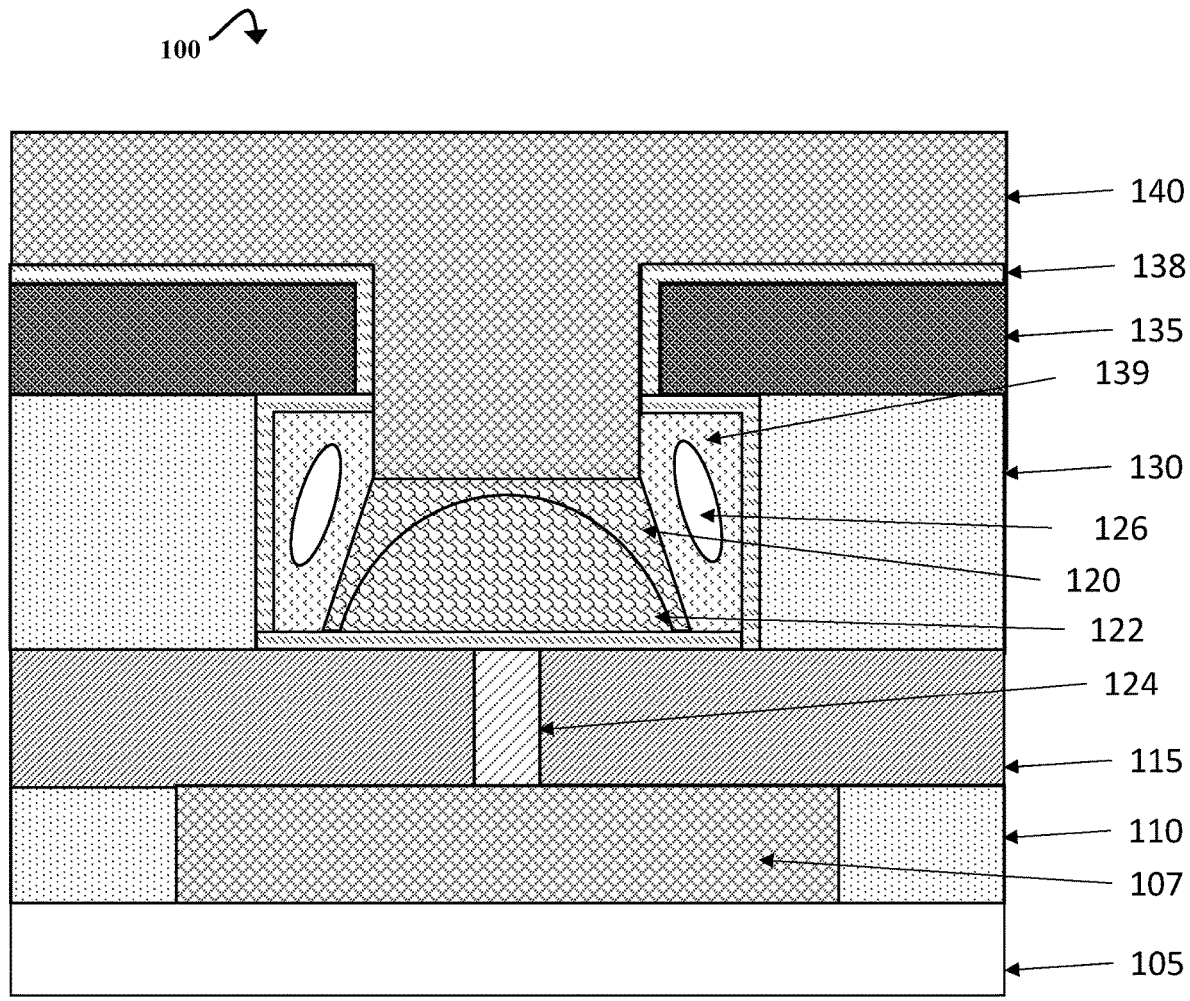

In FIG. 1K, of depositing the top electrode. In some embodiments, the top electrode may be deposited in the via (described above) and the top surface of cell 100. In some instances, the top electrode may be patterned or deposited with another deposition technique. The top electrode can consist of the same material as the aforementioned bottom electrode.

Figure 2:
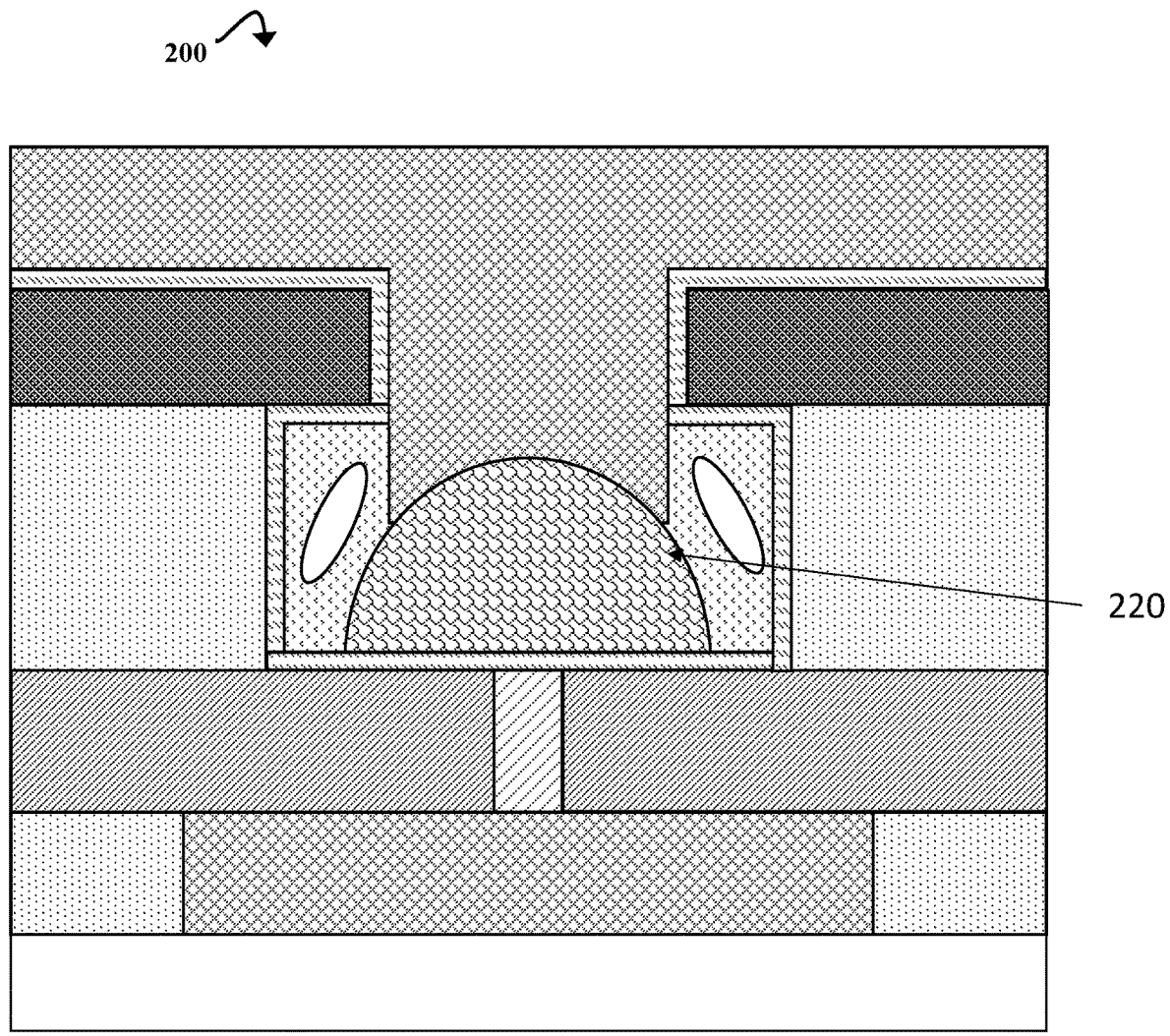
FIG. 2 depicts an example embodiment of a shaped phase change memory mushroom cell after fabrication, according to various embodiments of the present invention.

FIG. 2 depicts an example embodiment of a shaped phase change memory mushroom cell 200 after fabrication (similar to the fabrication process described in FIG. 1B—1H), where the PCM 220 is formed into a dome or half circle shape instead of a trapezoid shape. The disclosure is not limited to a trapezoid or a dome, but instead is used to demonstrate that by varying the deposition parameters (e.g., gas flow) a variety of shapes may be created.

Figure 3:
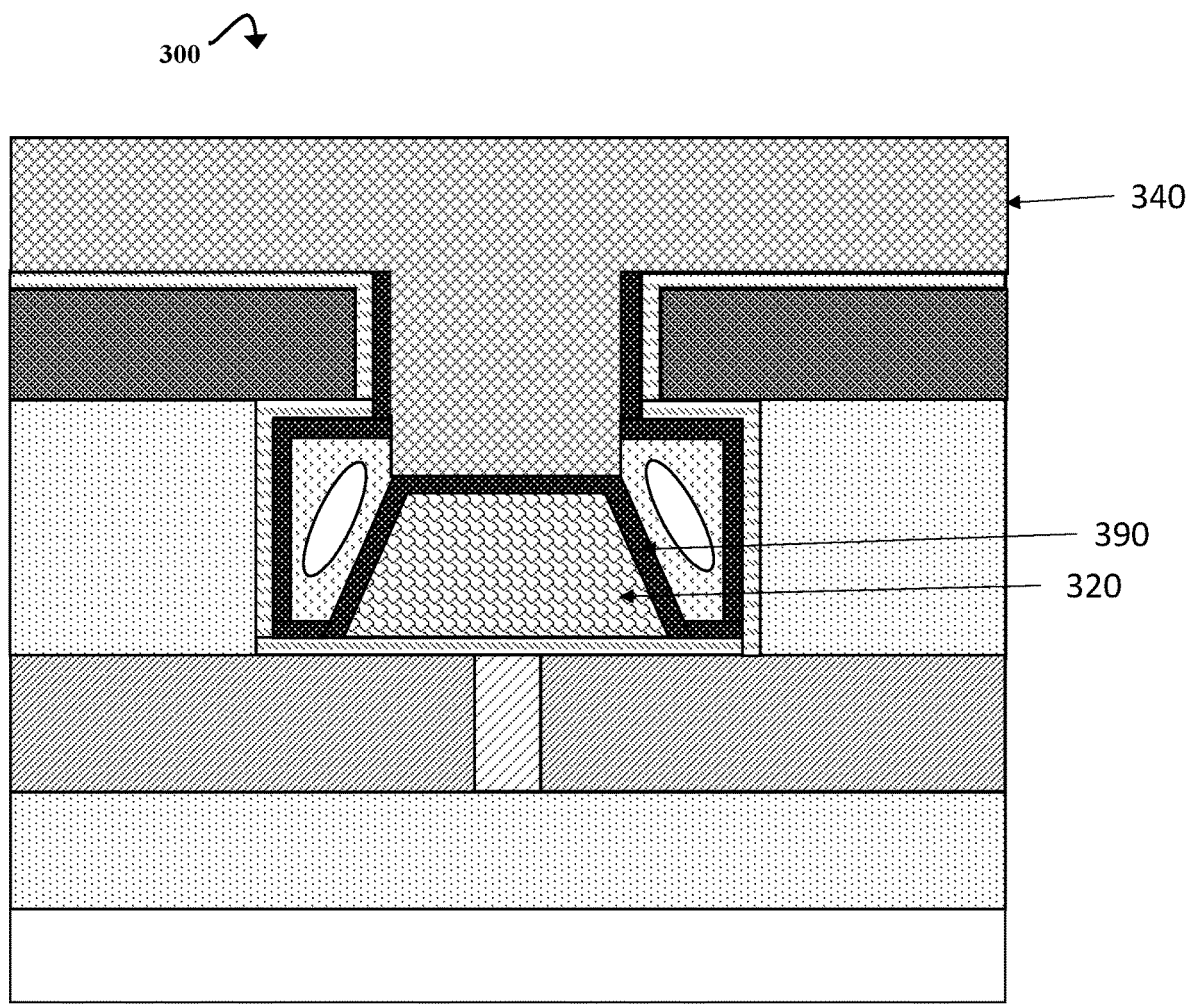
FIG. 3 depicts an example embodiment of a shaped phase change memory mushroom cell after fabrication, according to various embodiments of the present invention.

FIG. 3 depicts an example embodiment of a shaped phase change memory mushroom cell 300 after fabrication (similar to the process described in FIG. 1B-1H), where a metal liner 390 is deposited over a trapezoid shaped PCM 320. In some embodiments, the conductive metal liner may result in a more stable conductivity from PCM 320 to top electrode 340. For example, metal liner 390 may form a uniform conductive path from PCM 320 to top electrode 340.

Figure 4:
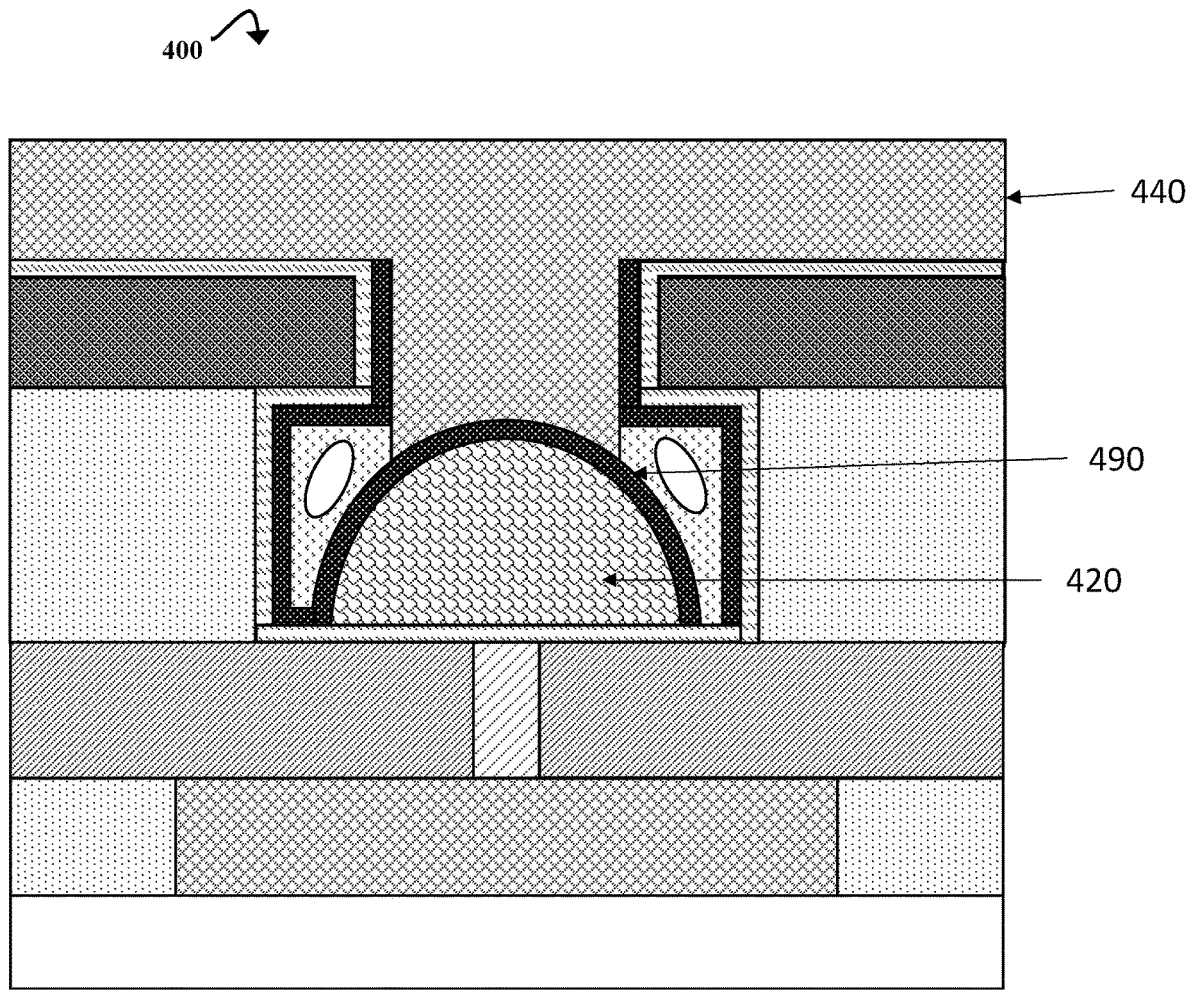
FIG. 4 depicts an example embodiment of a shaped phase change memory mushroom cell after fabrication, according to various embodiments of the present invention.

FIG. 4 depicts an example embodiment of a shaped phase change memory mushroom cell 400 after fabrication (similar to the process described in FIG. 1B-1H), where a metal liner 490 is deposited over a trapezoid shaped PCM 420. In some embodiments, the conductive metal liner may result in a more stable conductivity from PCM 420 to top electrode 440. For example, metal liner 490 may form a uniform conductive path from PCM 420 to top electrode 440.

Figure 5:
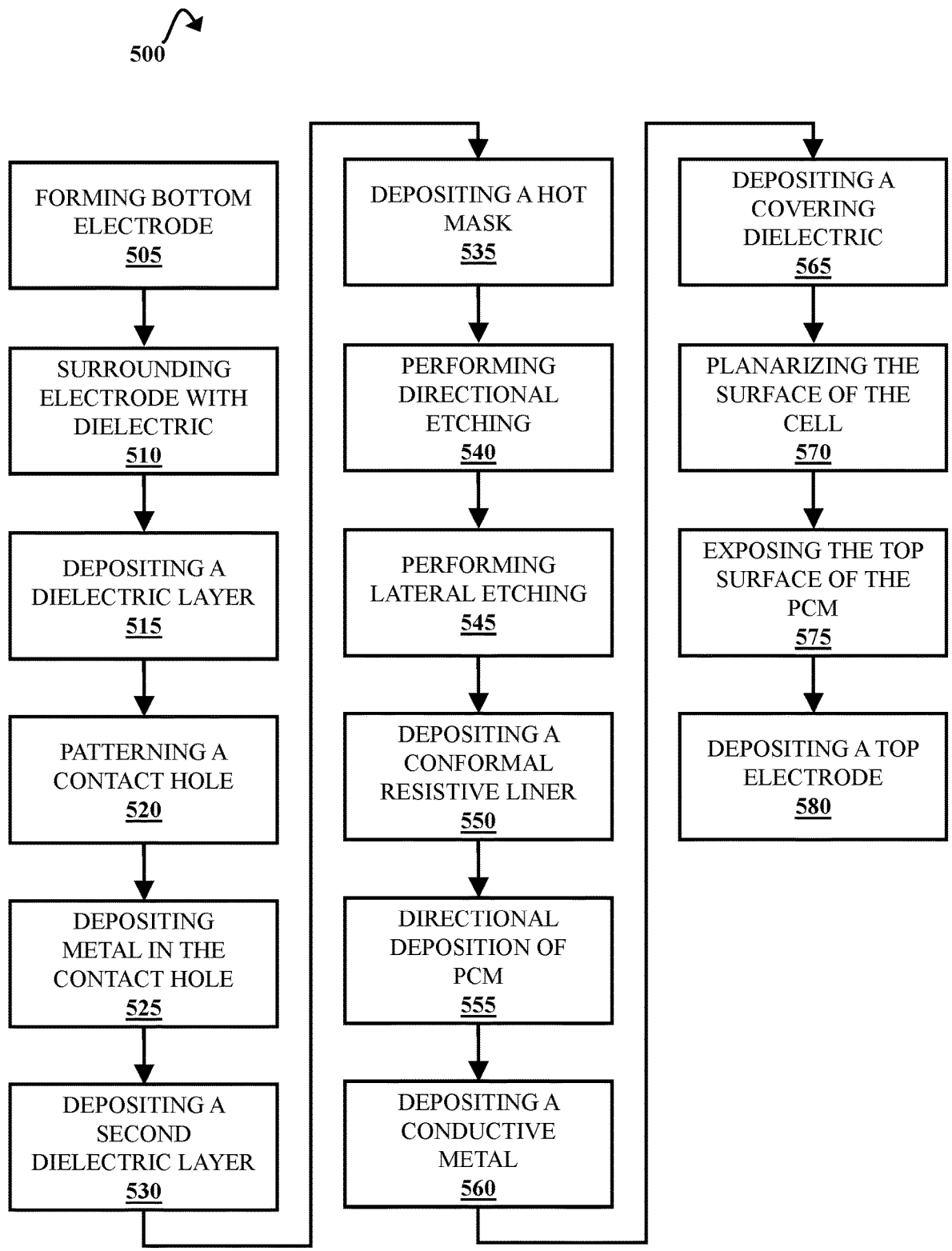
FIG. 5 depicts an example method 500 for fabricating phase change memory mushroom cells.

FIG. 5 depicts an example method 500 for fabricating phase change memory mushroom cells.

Method 500 begins with operation 505 of forming a bottom electrode on a substrate. In some embodiments, the bottom electrode is in contact with one or more components on the substrate. For example, the bottom electrode may be in contact with one or more transistors on the substrate.

Method 500 continues with operation 510 of surrounding the bottom electrode by a dielectric.

Method 500 continues with operation 515 of depositing a dielectric layer (e.g., dielectric 115) on the surface of the bottom electrode and the surrounding dielectric.

Method 500 continues with operation 520 continues with patterning a contact hole (e.g., a via) in the dielectric layer.

Method 500 continues with operation 525 of depositing metal in the hole to form a heater connected to the bottom electrode.

Method 500 continues with operation 530 of depositing a second dielectric layer on top of the first dielectric layer and the heater.

Method 500 continues with operation 535 of depositing a hard mask on top of the second dielectric layer.

Method 500 continues with operation 540 of performing a directional reactive-ion etching to remove the exposed portion of the second dielectric layer and expose the heater. In some embodiments, the etching and the first dielectric layer may be configured such that the reactive-ion etching does not etch the first dielectric layer.

Method 500 continues with operation 545 of performing a lateral etching to remove a portion of the second dielectric layer under hard mask 135.

Method 500 continues with operation 550 of depositing a conformal resistive liner on the heater, the exposed portion of the second dielectric layer and the exposed portion of the first dielectric layer.

Method 500 continues with operation 555 of directional deposition of a PCM over the heater (including the conformal resistive liner if the resistive liner was used).

Method 500 continues with operation 560 of depositing a conductive metal on the surface of the cell, covering the PCM.

Method 500 continues with operation 565 of depositing a covering dielectric over the PCM. In some embodiments, the deposition over the PCM may form one or more airgaps around the PCM.

Method 500 continues with operation 570 of planarizing the surface of the cell to remove excess PCM. In some embodiments, the planarizing may remove excess conductive metal and/or excess portions of the conformal resistive liner.

Method 500 continues with operation 575 of exposing the top surface of the PCM with a second directional etching to expose the top surface of the PCM. As described above, the top surface of the PCM may include the conductive metal on the surface of the PCM, where the second directional etching may not remove the conductive metal.

Method 500 continues with operation 580 of depositing the top electrode on the exposed surface of the cell.

Figure 6:
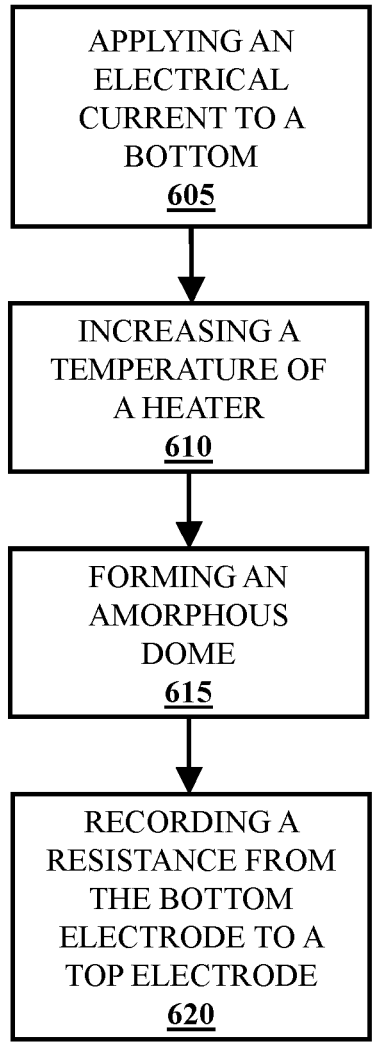
FIG. 6 depicts an example method 500 for using phase change memory mushroom cells.

FIG. 6 depicts an example method 600 for operating phase change memory mushroom cells.

Method 600 begins with operation 605 of applying an electrical current to a bottom electrode of a memory cell.

Method 600 continues with operation 610 of increasing a temperature, based on the applied electrical current, of a heater electrically connected to the bottom electrode.

Method 600 continues with operation 615 of forming an amorphous dome in a shaped phase change material (PCM) thermally and electrically connected to the heater based on the increasing temperature of the heater. In some embodiments, the proposed mushroom cell has a dome-shaped or trapezoid shaped crystalline phase change material cell, which has filled dielectric material (or dielectric material with airgaps embedded) on the PCM material sidewalls. For example, PCM is electrically insulated by a surrounding dielectric. In some instance, the shape may be a dome or trapezoid shape.

In some embodiments, switching from the high-resistance or "reset" state, where part or all of the phase change material is amorphous, occurs when a current pulse is applied that heats the amorphous material above the crystallization temperature for a sufficiently long time for the material to crystallize. The switch occurs because the threshold switching effect leads to a drastic and sudden (within nanoseconds) reduction of the resistance of the amorphous phase when a certain threshold field is surpassed, at a given threshold voltage.

Method 600 continues with operation 620 of recording a resistance from the bottom electrode to a top electrode, where the top electrode is electrically connected to the PCM.

Switching from the low-resistance or "set" state, where the phase change material is crystalline, is achieved by a high current pulse with a very short trailing edge. In typical PCM semiconductor applications, the current pulse heats the material by Joule heating, melts it, and enables very fast cooling (melt-quenching) such that the phase change material solidifies in the amorphous state. Since a phase change material permits reversible phase transformation in a typical case of a PCRAM device, the memory bit status can be distinguished by determining the state of phase change material in the memory bit.

In some embodiments, the shaped PCM gives a reduced contact area of between the top metal electrode and phase change material to reduce the thermal dissipation through PCM and top electrode, and thus improv the thermal insulation for reduced SE/RESET current.

In typical memory applications, switching from the high-resistance or "reset" state, where part or all of the phase change material is amorphous, occurs when a current pulse is applied that heats the amorphous material above the crystallization temperature for a sufficiently long time for the material to crystallize. The switch occurs because the threshold switching effect leads to a drastic and sudden (within nanoseconds) reduction of the resistance of the amorphous phase when a certain threshold field is surpassed, at a given threshold voltage. Switching from the low-resistance or "set" state, where the phase change material is crystalline, is achieved by a high current pulse with a very short trailing edge. In typical PCM semiconductor applications, the current pulse heats the material by Joule heating, melts it, and enables very fast cooling (melt-quenching) such that the phase change material solidifies in the amorphous state. Since a phase change material permits reversible phase transformation in a typical case of a PCRAM device, the memory bit status can be distinguished by determining the state of phase change material in the memory bit.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of creating a memory cell comprising:
   depositing a second dielectric layer on top of a first dielectric layer and a heater;
   depositing a hard mask on top of the second dielectric layer;
   performing a directional reactive-ion etching to remove an exposed portion of the second dielectric layer;
   performing a lateral etching to remove a portion of the second dielectric layer under the hard mask;
   performing directional deposition of a phase change material (PCM) dome over the heater;
   depositing a covering dielectric over and around the PCM dome;
   performing a second directional etching to expose a top surface of the PCM dome; and
   depositing a top electrode on the surface of the PCM dome.

2. The method of claim 1, wherein the method further comprises:
   depositing a conformal resistive liner on the heater and the exposed portion of the second dielectric layer and an exposed portion of the first dielectric layer.

3. The method of claim 1, further comprising:
   depositing a conductive metal on the PCM dome.

4. The method of claim 3, wherein the conductive metal deposited on the PCM dome forms the top surface of the PCM dome.

5. The method of claim 1, further comprising:
   planarizing a surface of the cell to remove a portion of the covering dielectric.

6. The method of claim 1, further comprising:
   forming a bottom electrode on a substrate;
   surrounding the bottom electrode with a dielectric;
   depositing the first dielectric layer on the surface of the bottom electrode and the surrounding dielectric;
   patterning a contact hole in the first dielectric layer; and
   forming the heater connected to the bottom electrode.

7. The method of claim 6, wherein the heater is formed by depositing metal in the hole.

8. A memory cell device comprising:
   a phase change material (PCM) dome over a heater; and
   a dielectric surrounding the PCM dome.

9. The memory cell of claim 8 further comprising:
   a conformal resistive liner between the PCM dome and the heater.

10. The memory cell of claim 8 further comprising:
    a conductive metal on the PCM dome.

11. The memory cell of claim 8 further comprising:
    a substrate with a transistor;
    a bottom electrode on the transistor;
    a dielectric material surrounding the bottom electrode;

a first dielectric layer on the bottom electrode;
a contact hole in the first dielectric layer; and
a heater in the contact hole connected to the PCM dome.

12. A method comprising:
applying an electrical current to a bottom electrode of a memory cell;
increasing a temperature, based on the applied electrical current, of a heater electrically connected to the bottom electrode;
forming an amorphous dome in a shaped phase change material (PCM) thermally and electrically connected to the heater based on the increasing temperature of the heater; and
recording a resistance from the bottom electrode to a top electrode, where the top electrode is electrically connected to the PCM.

13. The method of claim 12, wherein the PCM is electrically insulated by a surrounding dielectric.

14. The method of claim 12, wherein the PCM is electrically insulated by a surrounding airgap.

* * * * *